(12) United States Patent
Gold et al.

(10) Patent No.: US 10,462,926 B2
(45) Date of Patent: Oct. 29, 2019

(54) CANTED INFORMATION TECHNOLOGY RACKS AND SYSTEMS

(71) Applicant: Facebook, Inc., Menlo Park, CA (US)

(72) Inventors: Andrew Gold, Los Altos, CA (US); Scott C. Wiley, Los Altos, CA (US)

(73) Assignee: Facebook, Inc., Menlo Park, CA (US)

( * ) Notice: Subject to any disclaimer, the term of this patent is extended or adjusted under 35 U.S.C. 154(b) by 0 days.

(21) Appl. No.: 15/784,184

(22) Filed: Oct. 15, 2017

(65) Prior Publication Data

US 2019/0116684 A1    Apr. 18, 2019

(51) Int. Cl.
*H05K 7/14* (2006.01)
*H05K 7/20* (2006.01)
*H05K 7/18* (2006.01)

(52) U.S. Cl.
CPC .......... *H05K 7/1489* (2013.01); *H05K 7/183* (2013.01); *H05K 7/20545* (2013.01); *H05K 7/20709* (2013.01); *H05K 7/20836* (2013.01)

(58) Field of Classification Search
CPC . G06F 1/20; G06F 1/181; G06F 1/187; G06F 1/183; G06F 1/1632; G06F 1/206; G06F 2200/201; G06F 1/188; G06F 1/184; G06F 1/185; H05K 7/20736; H05K 7/20809; H05K 7/1489; H05K 7/20745; H05K 7/20836; H05K 7/20727; H05K 7/1492; H05K 7/1497; H05K 7/20145; H05K 7/20327; H05K 7/20818; H05K 7/1487; H05K 7/20172; H05K 7/20772; H05K 7/1488; H05K 7/20827; H05K 7/1494; H05K 7/20781; H05K 5/03; H05K 7/20; H05K 7/203; H05K 1/0203; H05K 7/1425; H05K 7/18; H05K 7/183; H05K 7/2049; H05K 7/20136; H05K 7/20163; H05K 7/20718; H05K 7/2079; G11B 33/128; G11B 33/142; G11B 33/1413

See application file for complete search history.

(56) References Cited

U.S. PATENT DOCUMENTS

| | | | | |
|---|---|---|---|---|
| 5,208,722 | A * | 5/1993 | Ryan | G06F 1/181 360/137 |
| 5,414,591 | A * | 5/1995 | Kimura | G06F 1/20 361/679.33 |
| 6,483,107 | B1 * | 11/2002 | Rabinovitz | G06F 1/181 250/239 |
| 6,501,659 | B1 * | 12/2002 | Bodensteiner | G06F 1/16 312/223.2 |
| 7,443,694 | B1 * | 10/2008 | Chen | H05K 7/1417 361/760 |

(Continued)

*Primary Examiner* — Adam B Dravininkas
(74) *Attorney, Agent, or Firm* — FisherBroyles, LLP

(57) ABSTRACT

The disclosed information technology rack may include (1) a frame with a group of vertical support bars that together define an equipment bay for housing information technology modules, where each vertical support bar is oriented substantially perpendicular relative to a floor on which the information technology rack stands and (2) a mounting structure, coupled to the vertical support bars of the frame, that is configured to mount at least one information technology module to the frame within the equipment bay in a substantially non-horizontal orientation relative to the floor on which the information technology rack stands.

20 Claims, 10 Drawing Sheets

(56) References Cited

U.S. PATENT DOCUMENTS

| | | | | |
|---|---|---|---|---|
| 8,638,553 B1* | 1/2014 | Czamara | ............ | H05K 7/20736 |
| | | | | 361/679.48 |
| 2004/0055984 A1* | 3/2004 | Gundlach | ............ | H05K 7/1418 |
| | | | | 211/183 |
| 2005/0265004 A1* | 12/2005 | Coglitore | ............ | H05K 7/1488 |
| | | | | 361/724 |
| 2005/0280986 A1* | 12/2005 | Coglitore | ................... | G06F 1/20 |
| | | | | 361/679.49 |
| 2012/0236487 A1* | 9/2012 | Wallace | ............... | H05K 7/1489 |
| | | | | 361/679.31 |
| 2012/0236491 A1* | 9/2012 | Wallace | ................... | G06F 1/187 |
| | | | | 361/679.33 |
| 2014/0027392 A1* | 1/2014 | Crippen | ............... | H05K 7/1488 |
| | | | | 211/26 |
| 2014/0216686 A1* | 8/2014 | Shelnutt | ............. | H05K 7/20809 |
| | | | | 165/67 |
| 2017/0135249 A1* | 5/2017 | Jensen | ............... | H05K 7/20736 |
| 2017/0181306 A1* | 6/2017 | Shaw | ........................ | H05K 7/10 |
| 2017/0311484 A1* | 10/2017 | Ozyalcin | ............ | H05K 7/20236 |

* cited by examiner

CANTED INFORMATION TECHNOLOGY RACKS AND SYSTEMS

BACKGROUND

As data centers grow to meet the demand for computational resources, a data center's ability to provide large-scale computation becomes increasingly important. One result of large-scale computation is heat waste generated by many computing devices operating in the same space (e.g., computing devices resting within information technology racks of the data center). If this heat waste is not effectively managed, the heat waste may interfere with the operation of the devices. Traditional data centers employ various cooling systems to manage heat waste. Such cooling systems may impose significant operating costs in the form of energy consumption, as well as costs for acquisition and maintenance. As such, a change in the construction of information technology racks that naturally cools heat waste by improving the airflow for computing devices resting within the information technology racks may unlock an efficient and cost-effective management tool for heat waste in the modern data center.

SUMMARY

As will be described in greater detail below, the instant disclosure generally relates to canted information technology racks and systems that naturally cool heat waste by improving the airflow for computing devices resting within information technology racks. In one example, an information technology rack may include (1) a frame with a group of vertical support bars that together define an equipment bay for housing information technology modules, where each vertical support bar is oriented substantially perpendicular relative to a floor on which the information technology rack stands and (2) a mounting structure, coupled to the vertical support bars of the frame, that is configured to mount at least one information technology module to the frame within the equipment bay in a substantially non-horizontal orientation relative to the floor on which the information technology rack stands.

In some examples, the mounting structure may include at least one of (1) one or more support shelves coupled to the vertical support bars, (2) one or more mounting holes defined in the vertical support bars, (3) one or more mounting posts coupled to the vertical support bars, (4) one or more brackets mounted to the vertical support bars, or (5) one or more screws coupled to the vertical support bars. In some examples, the information technology module may represent at least one of a server, a power supply, a network switch, or a battery backup unit.

In some embodiments, the substantially non-horizontal orientation of the mounting structure may facilitate the ventilation of air heated by the information technology module upwards through convection. Additionally or alternatively, the substantially non-horizontal orientation of the mounting structure may facilitate, through the force of gravity, at least one blind-mate connection between a connector of the information technology module and a corresponding connector coupled to the frame.

In one example, the group of vertical support bars may include a set of frontal support bars and a set of terminal support bars. In this example, the frame may be disposed in a data center with a cold-air aisle abutting the set of frontal support bars and a hot-air aisle abutting the set of terminal support bars. In one such example, the information technology module may be configured to be inserted into the equipment bay, such that the information technology module rests in the equipment bay in the substantially non-horizontal orientation of the mounting structure, via at least one of (1) the hot-air aisle or (2) the cold-air aisle. In some embodiments, the information technology module is configured to be inserted into the equipment bay by a robot.

In some examples, the instant disclosure presents an information technology rack that includes (1) a frame with support bars that together define an equipment bay for housing information technology modules and (2) mounting structures, coupled to the support bars, configured to mount information technology modules to the frame within the equipment bay in an ascending configuration in which an insertion depth of a superior information technology module is greater than an insertion depth of an inferior information technology module. In some examples, the information technology modules may also include a super-superior information technology module, positioned above the superior information technology module within the equipment bay, with an insertion depth that is greater than the insertion depth of the superior information technology module. In one example, the ascending configuration may facilitate the ventilation of air heated by the information technology modules through convection.

In one embodiment, the mounting structures may include (1) an inferior mounting structure, configured to mount the inferior information technology module, and (2) a superior mounting structure, configured to mount the superior information technology module. In this embodiment, the position of the superior mounting structure within the information technology rack may be posterior to the position of the inferior mounting structure within the information technology rack. In some examples, the support bars may include a set of frontal support bars and a set of terminal support bars. In these examples, (1) the information technology rack may be disposed in a data center with a cold-air aisle abutting the set of frontal support bars and a hot-air aisle abutting the set of terminal support bars, and (2) the position of the superior mounting structure relative to the hot-air aisle may be posterior to the position of the inferior mounting structure relative to the hot-air aisle.

In some examples, the instant disclosure presents a system that includes an information technology rack with at least one of the features described above. In one example, the system may include a linear aisle with a group of information technology racks that includes at least one information technology rack with the features described above.

Features from any of the above-mentioned embodiments may be used in combination with one another in accordance with the general principles described herein. These and other embodiments, features, and advantages will be more fully understood upon reading the following detailed description in conjunction with the accompanying drawings and claims.

BRIEF DESCRIPTION OF THE DRAWINGS

The accompanying drawings illustrate a number of exemplary embodiments and are a part of the specification. Together with the following description, these drawings demonstrate and explain various principles of the instant disclosure.

Figure 1:
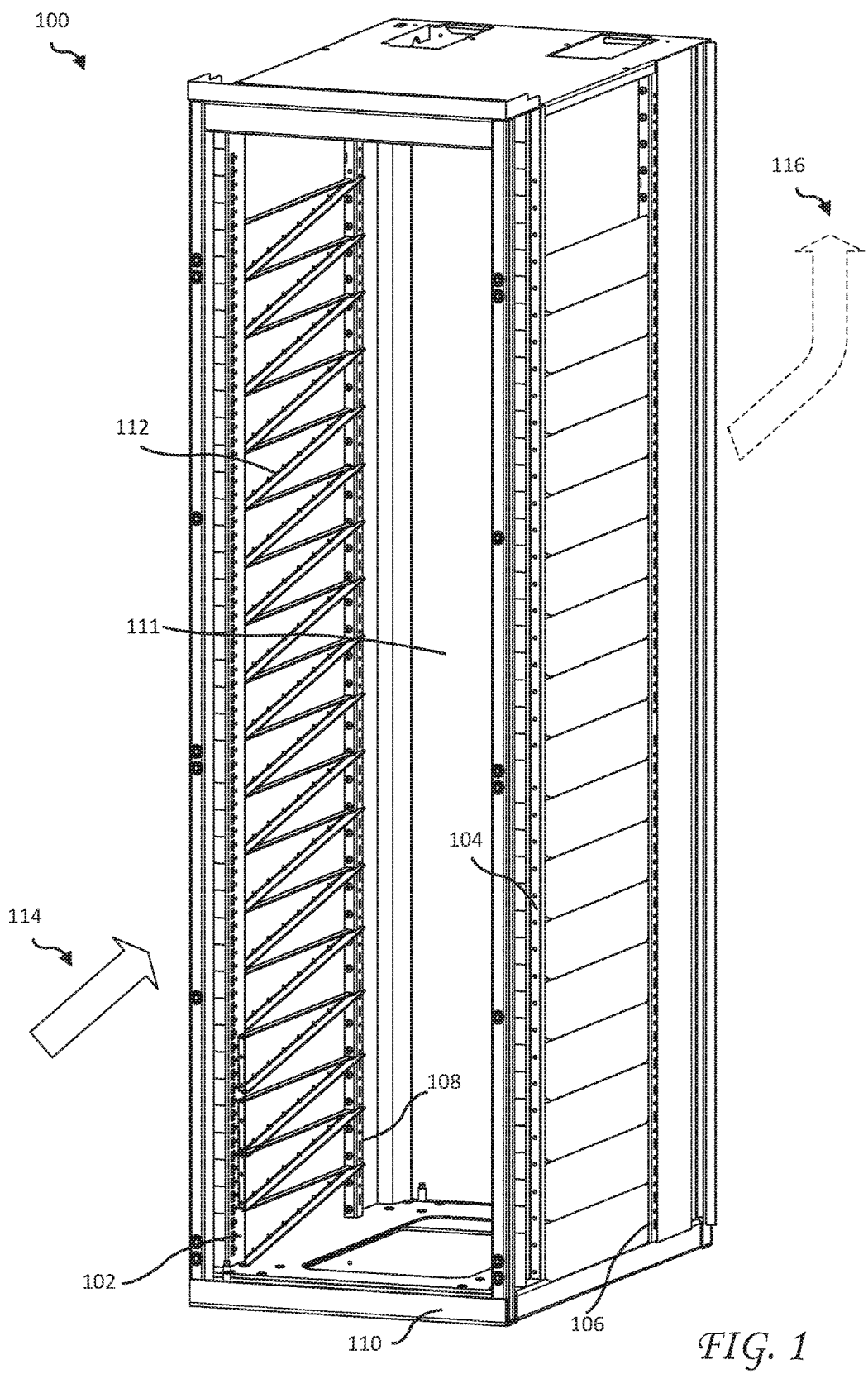
FIG. 1 is a perspective view of an information technology rack with a canted mounting structure.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the instant disclosure covers all modifications, equivalents, and alternatives falling within the scope of the appended claims.

DETAILED DESCRIPTION OF EXEMPLARY EMBODIMENTS

The present disclosure describes a variety of ways for altering the traditional structure of an information technology rack so that a tray resting within an equipment bay of the information technology rack may be canted relative to the floor on which the information technology rack stands. Hot air tends to rise due to its density relative to cooler air. Conventional trays within the information technology racks of data centers, however, are typically horizontally oriented within these information technology racks, which means hot air generated by information technology modules (e.g., servers, power supplies, network switches, etc.) must be forced horizontally through and out the tray and fan exhaust before the hot air can be exhausted/vented upwards (and, e.g., out of the data center).

Instead of orienting trays horizontally (i.e., substantially parallel to the floor/ceiling of a data center), the present disclosure describes trays that may be at least partially canted relative to the floor/ceiling to aid in venting hot air from the tray. The trays may be pushed or pulled into the equipment bay by humans or robots from either direction (e.g., via a hot aisle or a cold aisle), depending on design needs. Blind-mates for network, power, and other connections may be disposed at the terminal end of the rack, and equipment may be inserted/removed from the opposite end. The canted orientation of the rack trays may, due to gravity, also facilitate the mating of the blind-connections. In some examples, the present disclosure also describes an information technology rack for housing information technology modules in an ascending configuration. In these examples, the ascending configuration may facilitate venting hot air by reducing the amount of vented heat blocked by superior information technology modules positioned above the information technology module within the information technology rack.

The following will provide, with reference to FIGS. 1-6, examples of information technology racks with a canted mounting structure. Also, the discussion corresponding to FIG. 7 will provide examples of a gantry robot system that may be used for interacting with information technology racks with the features described herein. Finally, the discussion associated with FIGS. 8-10 will provide examples of information technology racks with ascending information technology modules and/or ascending mounting structures and/or an ascending frame configuration.

FIG. 1 shows an information technology rack 100 configured to store information technology modules. As used herein, the term "information technology rack" may refer to any structure for housing multiple information technology modules. In some examples, an information technology rack may also house and/or provide support for one or more cables that connect to information technology modules. In addition, an information technology rack may house information technology modules in a grid pattern (see, e.g., FIG. 4, which illustrates an embodiment of information technology rack 100 in which information technology rack 100 houses a group of information technology modules in a grid pattern). In one embodiment, an information technology rack may be embedded in a wall of a data center. In other examples, an information technology rack may be portable. In some examples, the information technology rack may take the form of a pallet rack.

As used herein, the term "information technology module" may refer to any modular device that may include and/or form a part of a computing system. Examples of information technology modules include, without limitation, servers, power supplies (e.g., power shelves) and power modules, network switches, computing devices, networking devices, power devices and/or battery backup units. In some examples, a heterogeneous set of information technology modules may operate within a single information technology rack. For example, a single information technology rack may connect servers, power supplies, network switches, and battery backup units within a computing infrastructure. An information technology rack may connect information technology modules within a computing infrastructure in any suitable manner. For example, an information technology rack may include one or more cables and/or connectors that connect to stored information technology modules and that transmit a signal between information technology modules and/or between an information technology module and another system.

As used herein, the term "computing infrastructure" may refer to any collection of devices and/or components that may collectively provide computational resources. A computing infrastructure with modular components, as described herein, may be used in any of a variety of contexts. In some examples, a computing infrastructure may provide computation in a cloud computing environment. Additionally or alternatively, a computing infrastructure may provide computation in a parallel computing environment. In some examples, a computing infrastructure may represent a collection of underlying physical computing resources that may be allocated and/or virtualized to provide one or more logical and/or virtual computing resources.

Returning to FIG. 1, information technology rack 100 may include a frame made of a group of vertical support bars (e.g., frontal vertical support bar 102, frontal vertical support bar 104, terminal vertical support bar 106, and terminal vertical support bar 108), each of which may be oriented substantially perpendicular relative to the floor on which information technology rack 100 stands. In one example, the group of vertical support bars may also be oriented substantially perpendicular relative to a base 110 of information technology rack 100. Together, the group of vertical support bars may define an equipment bay 111 for housing information technology modules.

As shown in FIG. 1, information technology rack 100 may include one or more mounting structures (such as canted mounting structure 112) that are coupled to the group of vertical support bars. These mounting structures may be configured to mount at least one information technology module to the frame within the equipment bay in a substantially non-horizontal orientation (i.e., a "canted" orientation) relative to the floor on which the information technology rack stands. In some examples, the mounting structures may be configured to mount an information technology module by mounting a support sled or other mount that contains the information technology module. In one embodiment, the one or more mounting structures may be configured to mount information technology modules such that the terminal end of each information technology module is elevated relative to the frontal end of the information technology module.

Figure 2:
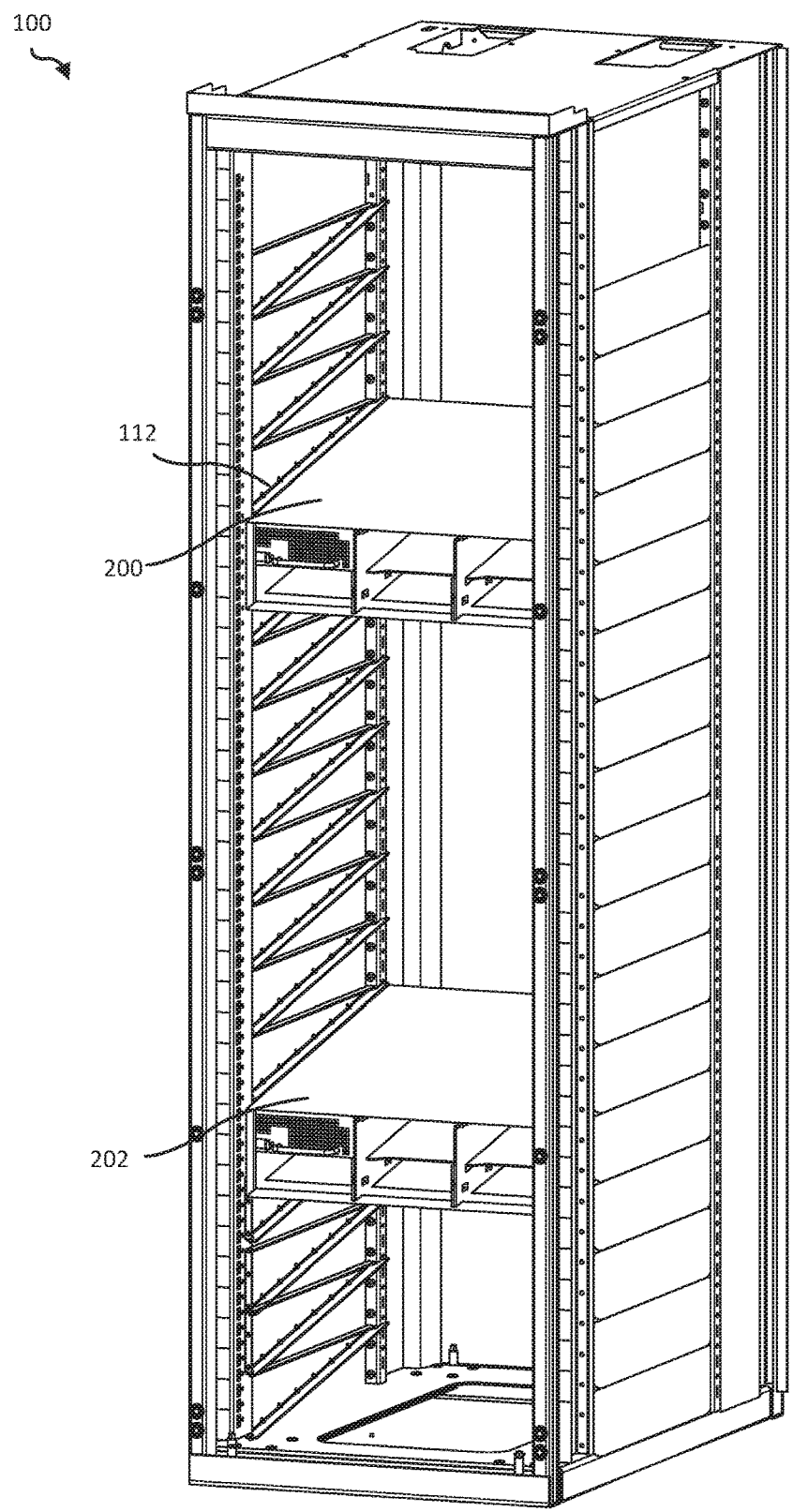
FIG. 2 is a perspective view of an information technology rack with a canted mounting structure and a power shelf mounted to the same.
Figure 4:
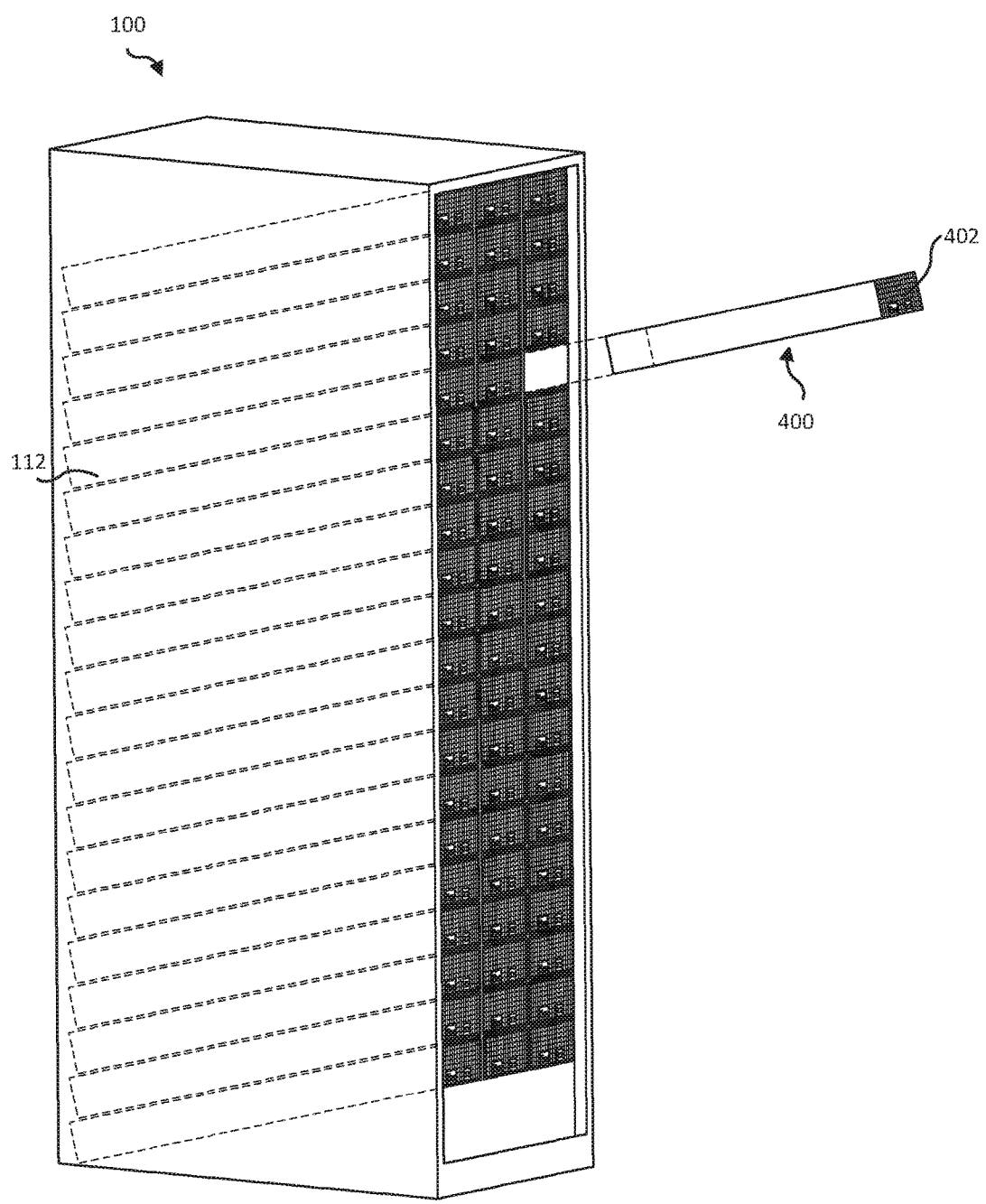
FIG. 4 is a perspective view of an information technology rack with a canted mounting structure and an information technology module mounted to the same.

For example, as shown in FIG. 4, one or more mounting structures may be configured to mount information technology modules (including information technology module 400) such that the information technology modules are in a substantially non-horizontal orientation (i.e., a "canted" orientation) relative to the floor. As another example, FIG. 2 illustrates an embodiment of information technology rack 100 with mounting structures (including canted mounting structure 112) that mount power shelves (e.g., power shelf 200 and power shelf 202) in a substantially non-horizontal orientation relative to the floor. As used herein, the term "power shelf" generally refers to any type or form of information technology module configured to provide power within an information technology rack. In one embodiment, a power shelf may house a rectifier and/or a battery to provide power to other information technology modules within an information technology rack.

Figure 3:
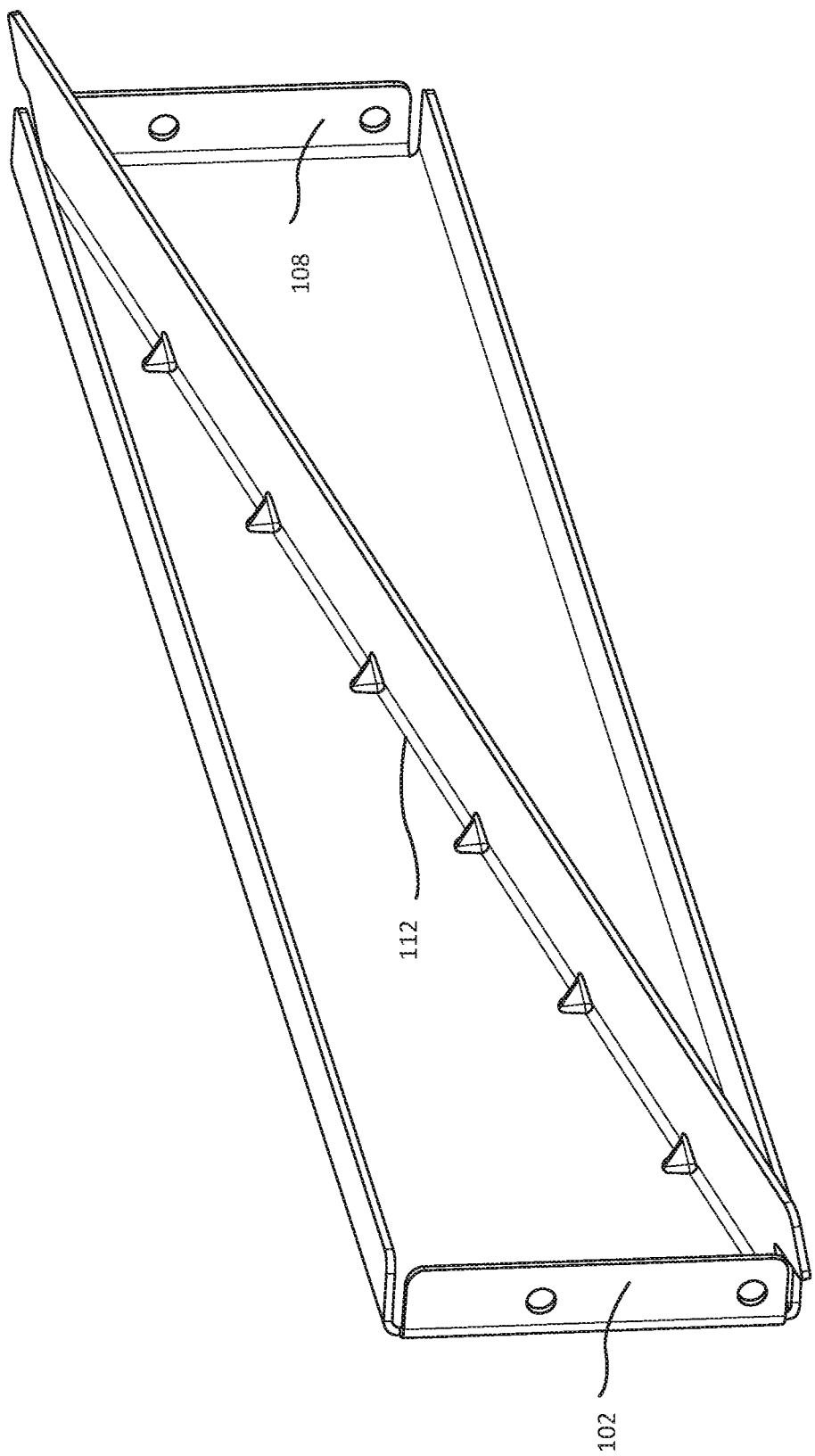
FIG. 3 is a side view of a canted mounting structure within an information technology rack.

These mounting structures may represent any type or form of structure that mounts an information technology module such that the information technology module is canted (i.e., in a substantially non-horizontal orientation) relative to the floor. In some examples (e.g., as shown in FIGS. 1 and 3), canted mounting structure 112 may represent a support shelf coupled to the vertical support bars. In one embodiment, the one or more mounting structures may be an integral part of the frame included within information technology rack 100 (e.g., the one or more mounting structures may be welded to information technology rack 100). In other examples, the one or more mounting structures may represent one or more mounting holes that are defined within the group of vertical support bars. Additionally or alternatively, the one or more mounting structures may represent one or more posts and/or screws that are coupled to the vertical support bars (e.g., posts and/or screws that are mounted in the mounting holes). In one example, the one or more mounting structures may represent one or more brackets mounted to the group of vertical support bars.

The specified angle at which the mounting structures may be oriented relative to the floor (e.g., an angle 512 at which a canted mounting structure 514 may be oriented relative to a floor 516) may include any suitable non-horizontal angle relative to the floor, without limitation. For example, the specified angle may be in a range from approximately 1-5 degrees, approximately 5-10 degrees, approximately 10-15 degrees, approximately 15-20 degrees, approximately 20-25 degrees, approximately 25-30 degrees, approximately 30-35 degrees, approximately 35-40 degrees, approximately 40-45 degrees, approximately 45-50 degrees, approximately 50-55 degrees, approximately 55-60 degrees, approximately 60-65 degrees, approximately 65-70 degrees, approximately 70-75 degrees, approximately 75-80 degrees, approximately 80-85 degrees, and/or approximately 85-90 degrees. In some examples, the specified angle at which the mounting structures are oriented may be fixed within the information technology rack. In other examples, the specified angle at which the mounting structures are oriented may be adjustable.

In one embodiment, the canted orientation of the one or more mounting structures may facilitate the ventilation of air heated by an information technology module (i.e., an information technology module resting on the one or more mounting structures) upwards through convection. For example, as shown in FIG. 1, the canted orientation of canted mounting structure 112 may facilitate the ventilation of air heated by an information technology module configured to rest upon canted mounting structure 112 (which will, as a result of resting upon canted mounting structure 112, adopt the canted orientated of canted mounting structure 112) upwards in the direction illustrated by arrow 116. As another example, as shown in FIG. 4, the canted orientation of canted mounting structure 112 may facilitate the ventilation of air heated by information technology module 400 upwards (e.g., through ventilation holes 402).

Figure 5:
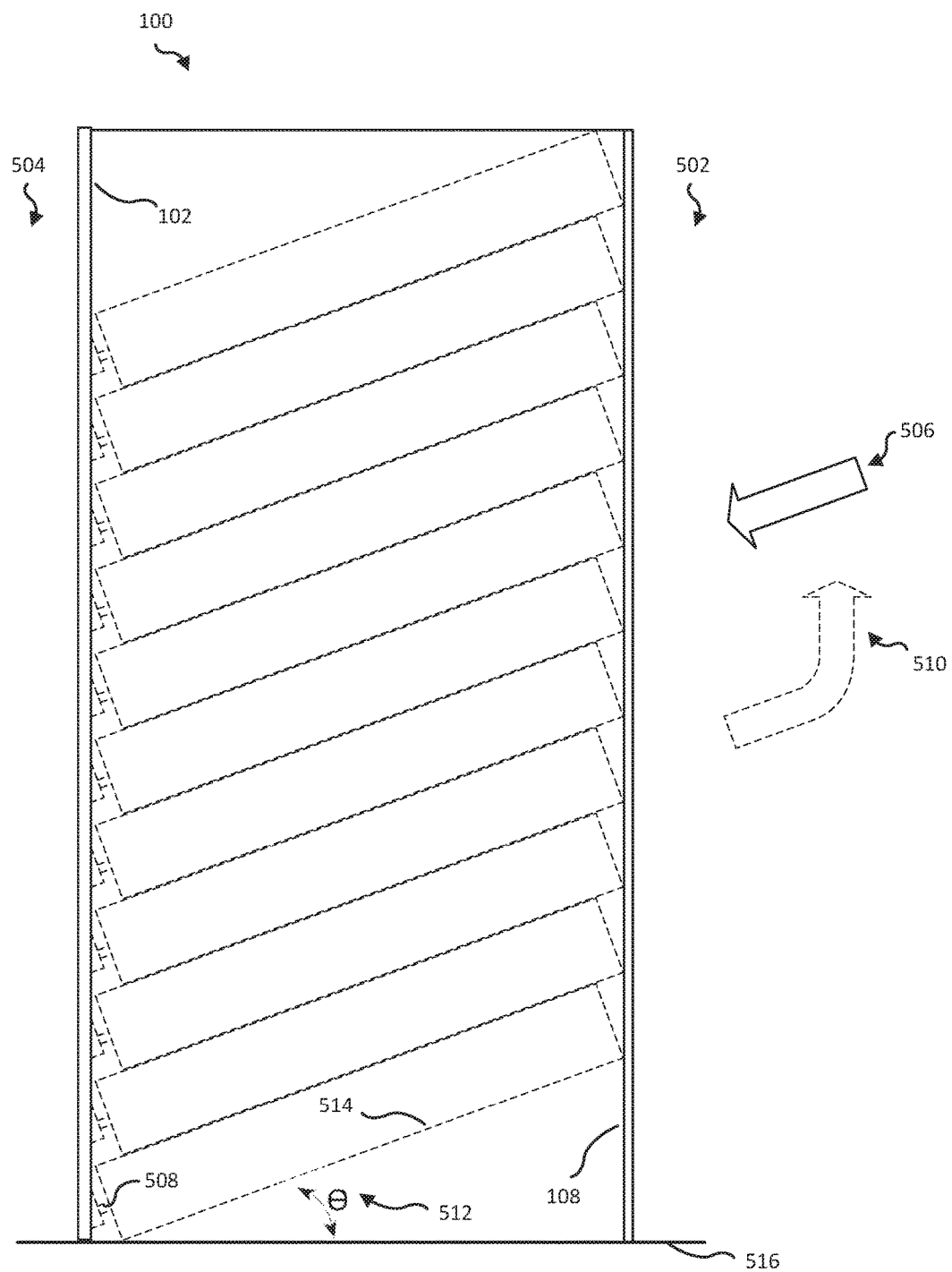
FIG. 5 is a side view of an information technology rack in which information technology modules are inserted into the equipment bay of the information technology rack via a hot-air aisle in the downward direction with the assistance of gravity.

In additional or alternative embodiments, the canted orientation of canted mounting structure 112 may facilitate, through the force of gravity, at least one blind-mate connection between a connector of an information technology module and a corresponding connector coupled to the frame of information technology rack 100. For example, FIG. 5 illustrates a side angle of information technology rack 100 in which information technology rack 100 is disposed in a data center with (1) a hot-air aisle 502 abutting terminal vertical support bar 106 and terminal vertical support bar 108 and (2) a cold-air aisle 504 abutting frontal vertical support bar 102 and frontal vertical support bar 104. In this example, an information technology module may be inserted into an equipment bay of information technology rack 100 via hot-air aisle 502 in the downward direction illustrated by arrow 506. As the information technology module is inserted in a canted orientation toward a blind-mate connector 508, the force of gravity may facilitate a blind-mate connection between a blind-mate connector of the information technology module and blind-mate connector 508.

As used herein, the term "blind-mate connector" generally refers to any type or form of connector that enables connectivity, such as via a sliding action. In some embodiments, a blind-mate connector may also have tolerance for imprecise alignments, allowing a connection to be made without dexterous manipulation of the parts of the connector. For example, a blind-mate connector may establish a connection by two blind-mate connector parts being pushed against one another. A blind-mate connection, as used herein, may refer to any type or form of connection, including, without limitation, a power connection and/or a network connection. In some embodiments, an information technology module may be configured with only one blind-mate connector. In other embodiments, an information technology module may be configured with multiple blind-mate connectors that may enable the information technology device module to connect with multiple cables and/or other components held by an information technology rack.

Figure 6:
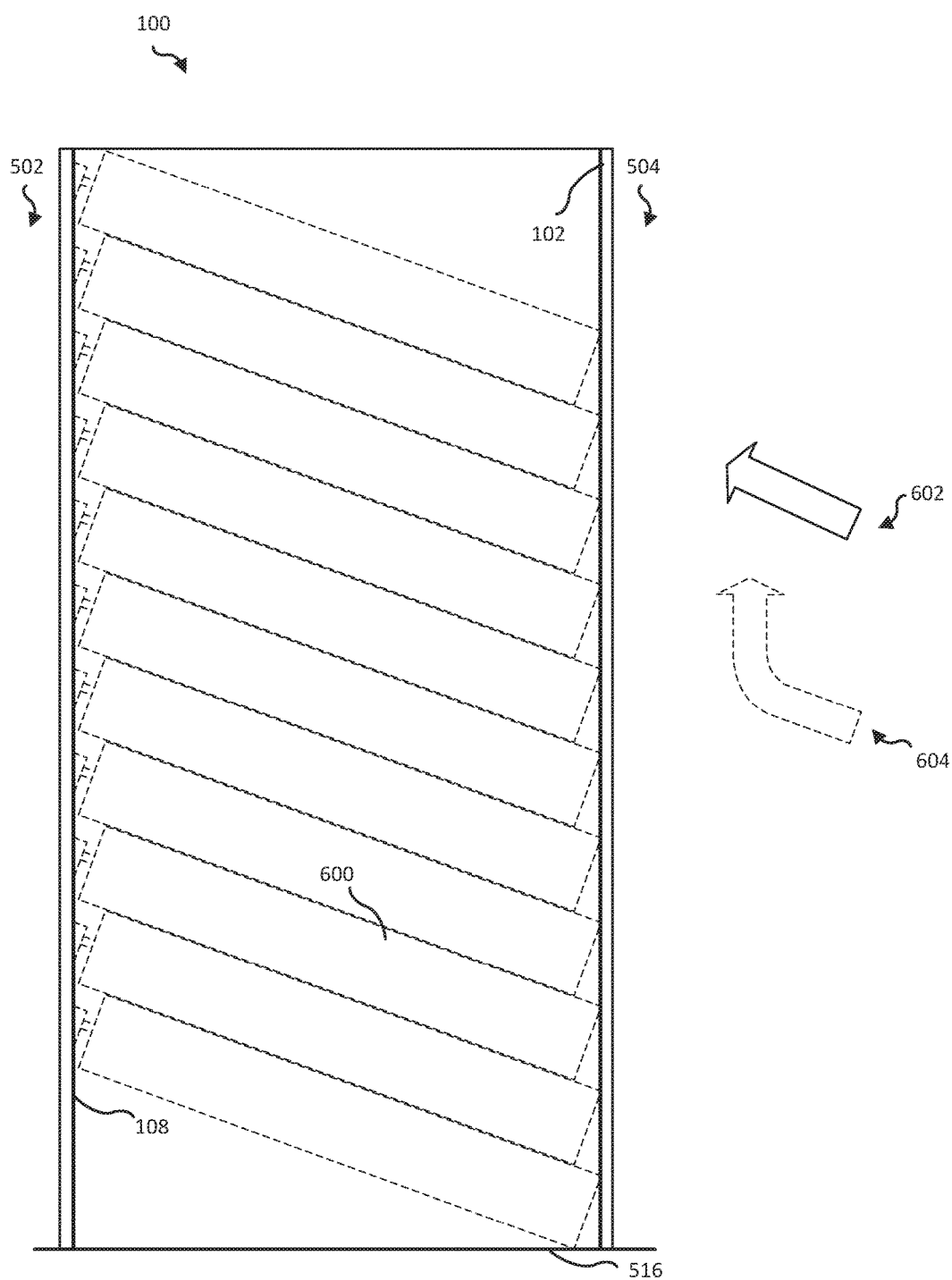
FIG. 6 is a side view of an information technology rack in which information technology modules are inserted into the equipment bay of the information technology rack via a cold-air aisle against gravity.

In some examples, as illustrated in FIG. 5 and discussed above, an information technology module may be inserted into the equipment bay of an information technology rack via a hot-air aisle (e.g., hot-air aisle 502). In other examples, an information technology module may be inserted into the equipment bay via a cold-air aisle. For example, as illustrated in FIG. 6, an information technology module 600 may be inserted into the equipment bay of information technology rack 100 via a cold-air aisle 504 in the direction illustrated by arrow 602. In both of these examples, (1) an aisle abutting frontal vertical support bar 102 and frontal vertical support bar 104 may represent a cold-air aisle (i.e., cold-air aisle 504) and (2) an aisle abutting terminal vertical support bar 106 and terminal vertical support bar 108 may represent a hot-air aisle (i.e., hot-air aisle 502) because the aisle abutting the terminal vertical support bars is elevated relative to the aisle abutting the frontal vertical support bars and, as shown by arrow 510 in FIG. 5 and arrow 604 in FIG. 6, hot air rises.

In examples in which the information technology module is inserted against gravity into the equipment bay via the cold-air aisle (e.g., as illustrated by arrow 114 in FIG. 1), the information technology module may be inserted by a human and/or by a robot. In examples in which an information technology module is inserted into the equipment bay via the hot-air aisle (which may be less accessible to humans due to heat), the information technology module may be inserted by a robot (i.e., a robotic system). The information technology module may be inserted using any type or form of semi-automated or fully-automated robotic system, such as a gantry robot and/or a mobile robot.

Figure 7:
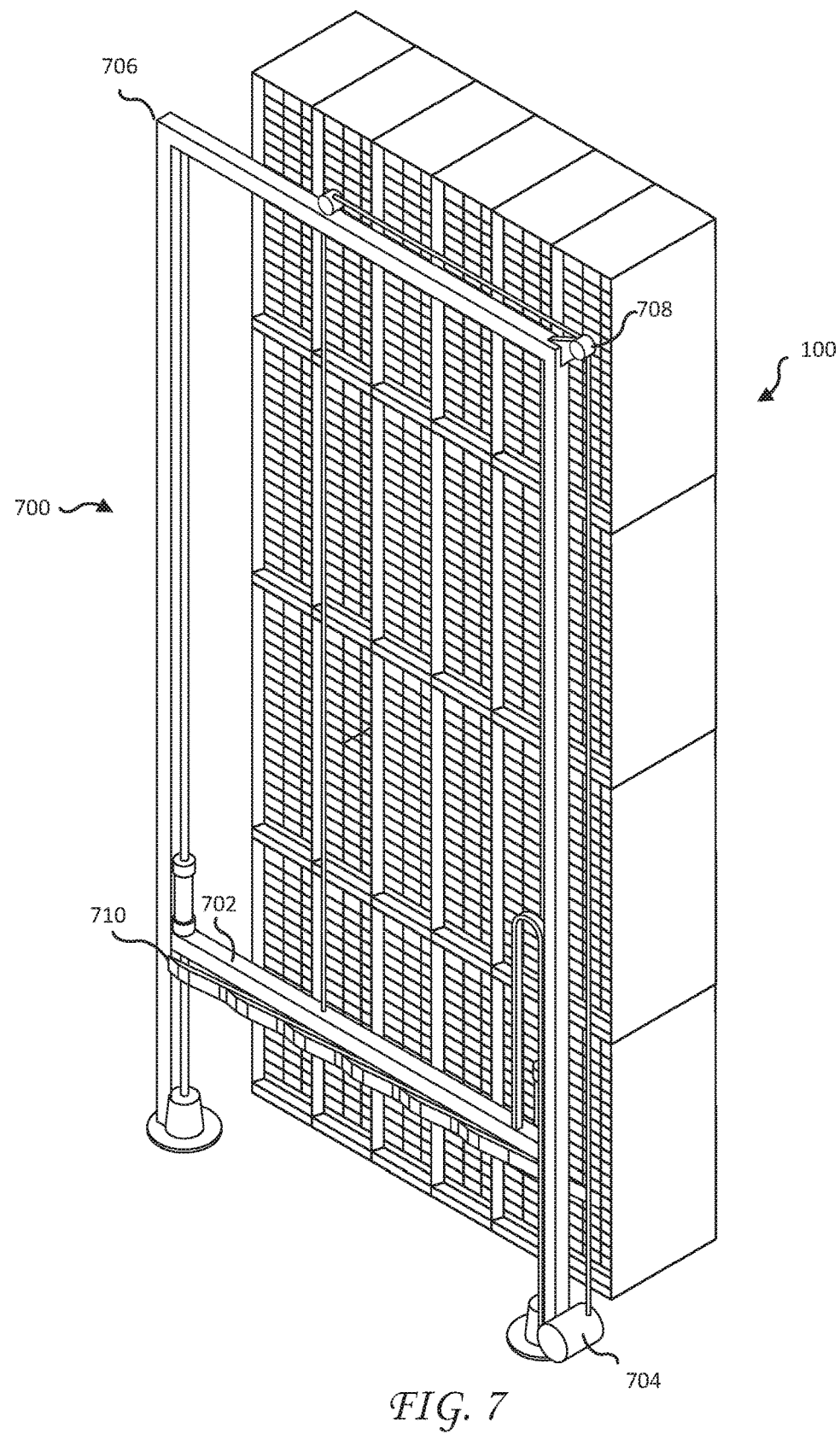
FIG. 7 is a perspective view of an information technology rack with a gantry robot.

FIG. 4 illustrates an information technology module (i.e., information technology module 400) being inserted by a gantry robot into an embodiment of information technology rack 100 that is compatible for use with a gantry robot (gantry robot not illustrated in FIG. 4). FIG. 7 illustrates a gantry robot 700 positioned in front of an embodiment of information technology rack 100. The term "gantry," as used herein, may refer to any rigid structure adapted to provide movement for an operative assembly across an area defined by the rigid structure. Accordingly, the term "gantry robot," as used herein, may refer to any gantry adapted to provide such movement for an operative assembly to perform programmable, automated tasks. For example, gantry robot 700 may be adapted to move a sliding element 702 parallel to a face of information technology rack 100 that exposes information technology devices that are stored by the information technology rack and that thereby connect to and operate within a computing infrastructure.

In one example, a motor 704 may drive sliding element 702 along a frame 706 of gantry robot 700. For example, motor 704 may drive a pulley 708 to move sliding element 702 up or down frame 706 of gantry robot 700. In some examples, a track may be coupled to sliding element 702. The track may extend away from sliding element 702 and toward the face of the information technology rack. For example, sliding element 702 may support one or more trays, including a tray 710. In this example, tray 710 may include a track (e.g., on the underside of tray 710, not visible in FIG. 7) that runs perpendicular to sliding element 702. Thus, the track may be coupled to sliding element 702 via tray 710. Gantry robot 700 may also include an engaging element (e.g., on the underside of tray 710, not visible in FIG. 7) that is adapted to move along the track and to engage with one or more of the information technology modules stored by information technology rack 100, such that the engaging element is adapted to insert into information technology rack 100 and remove from information technology rack 100 one or more of the information technology modules.

Gantry robot 700 may remove or insert an information technology module in any of a variety of contexts. For example, gantry robot 700 may remove an information technology module from information technology rack 100 in response to a signal from information technology rack 100 that the information technology module is to be removed (e.g., a signal indicating that the information technology module is defective and/or a signal that a slot within information technology rack 100 is available). As another example, gantry robot 700 may receive instructions to insert, remove, move, and/or replace modules from a data center coordination system that maintains a map of information technology modules and information technology racks within a data center.

In examples in which information technology modules are inserted via the cold-air aisle, information technology modules may be inserted against gravity (as illustrated by arrow 114 in FIG. 1). In these example, the use of a robot may ease the physical burden that pushing information technology modules against gravity may impose on humans. In examples in which information technology modules are inserted via the hot-air aisle, the use of a robot may ease the physical burden that pushing information technology modules from a heated area (in some instances, with a temperature that prohibits human presence) may impose on humans.

Examples of the instant disclosure may also include an information technology rack, which may include any of the features described above, configured to house information technology modules in an ascending configuration that facilitates the ventilation of air heated by the information technology modules through convection (e.g., by venting through the side or sides, such as the top side, least obstructed by superior information technology modules). In one example, such an information technology rack may include (1) a frame with support bars that together define an equipment bay for housing information technology modules and (2) mounting structures, coupled to the support bars, configured to mount information technology modules to the frame within the equipment bay in the ascending configuration.

As used herein, the term "ascending configuration" refers to any type or form of stacked or sloped configuration imposed on a collection of information technology modules in which at least one information technology module is inserted into an equipment bay at an insertion depth that is greater than the insertion depth of at least one inferior information technology module positioned within the equipment bay. In some examples, the configuration of the collection of information technology modules may mimic the configuration of a staircase. In one example, a position of each information technology module may be posterior within the equipment bay to a position of every inferior information technology module within the equipment bay. In another example, a first set information technology modules may be positioned within the equipment bay at a first insertion depth and a second set of superior information technology modules may be positioned at a second insertion depth that is greater than the first insertion depth.

The term "insertion depth," as used herein, generally refers to any type or form of physical distance between a face of an information technology rack and an end (i.e., a front end or a back end) of an information technology module positioned within an equipment bay of the information technology rack. In one embodiment, the insertion depth may refer to the distance between (1) the face of the information technology rack through which an information technology rack is inserted and (2) the end of the information technology module nearest to said face. In other embodiments, the insertion depth may refer to the distance between (1) the face of the information technology rack abutting a hot-air aisle and (2) the end of an information technology module nearest to the face of the information technology rack abutting the hot-air aisle. Alternatively, the insertion depth may refer to the distance between (1) the face of the information technology rack abutting a cold-air aisle and (2) the end of an information technology module nearest to the face of the information technology rack abutting the cold-air aisle.

Figure 8:
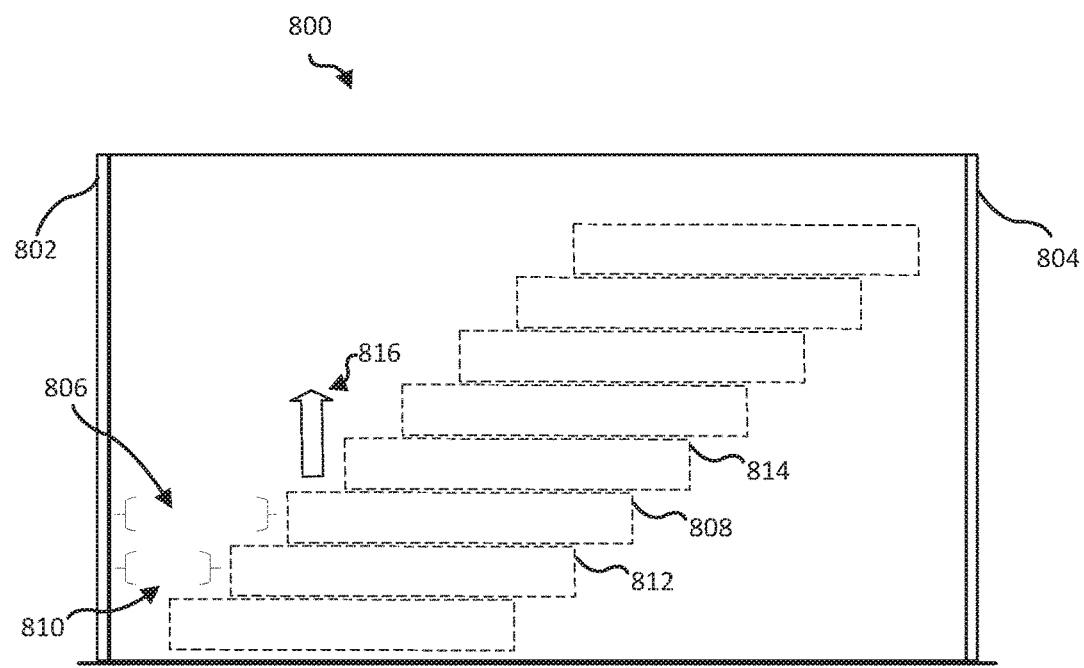
FIG. 8 is a side view of an information technology rack with ascending information technology modules.

Using FIG. 8 as a specific example, an information technology rack 800 may include a frame with support bars 802 and 804 that define an equipment bay for housing information technology modules. In this example, information technology rack 800 may include mounting structures (not shown in FIG. 8) configured to mount the information technology modules in an ascending configuration in which an insertion depth 806 of a superior information technology module 808 is greater than an insertion depth 810 of an inferior information technology module 812 positioned below superior information technology module 808 within information technology rack 800. Additionally, an insertion depth of a super-superior information technology module 814, positioned above superior information technology module 808 within information technology rack 800, may be greater than insertion depth 806.

In some examples, the mounting structures in information technology rack 800 may be in a non-horizontal orientation relative to a floor on which information technology rack 800 stands (e.g., in the orientation illustrated by canted mounting structure 112 in FIG. 1). Alternatively, the mounting structures may be in a horizontal orientation (e.g., a parallel orientation) relative to the floor.

Figure 9:
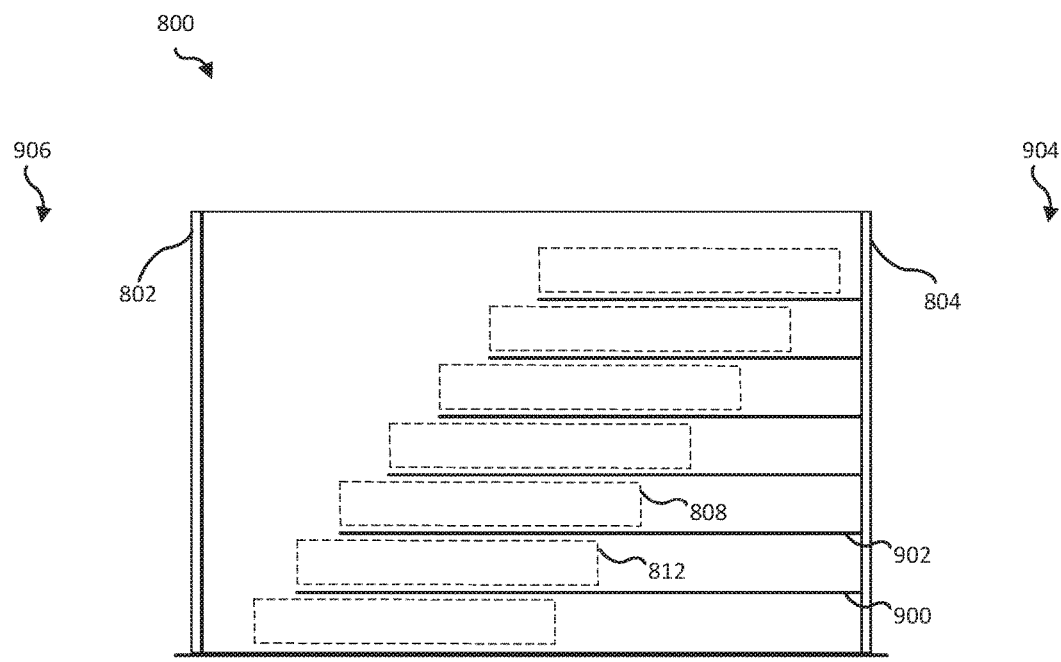
FIG. 9 is a side view of an information technology rack with ascending information technology modules and ascending mounting structures.

In one embodiment, the mounting structures may themselves be positioned within information technology rack 800 in an ascending configuration, as illustrated in FIG. 9. In this embodiment, (1) the mounting structures may include (i) an inferior mounting structure 900, configured to mount inferior information technology module 812, and (ii) a superior mounting structure 902, configured to mount superior information technology module 808, and (2) the position of superior mounting structure 902 within information technology rack 800 may be both superior and posterior to the position of inferior mounting structure 900 within information technology rack 800. Thus, in this embodiment, inferior information technology module 812 and superior information technology module 808 may adopt the configuration of the inferior and superior mounting structures (900 and 902) when inserted into the equipment bay.

In some examples, (1) the support bars may include a set of frontal support bars (including support bar 804) and a set of terminal support bars (including support bar 802) and (2) information technology rack 800 may be disposed in a data center with a cold-air aisle 904 abutting the set of frontal support bars and a hot-air aisle 906 abutting the set of terminal support bars. In these examples, the position of superior mounting structure 902 relative to hot-air aisle 906 may be posterior to the position of inferior mounting structure 900 relative to hot-air aisle 906, as shown in FIG. 9.

In an alternative embodiment, each of the mounting structures may be positioned within information technology rack 800 in a uniform insertion-depth configuration in which the mounting structures are located at varying vertical positions but none of the mounting structures are positioned more or less posteriorly than any of the other mounting structures (e.g., as illustrated in FIG. 1). In this embodiment, the ascending configuration may be introduced as the information technology modules are inserted into information technology rack 800 by inserting the information technology racks at ascending insertion depths. In some such embodiments, each mounting structure may include a blocking mechanism that blocks further insertion of an information technology module at a particular insertion point. Additionally or alternatively, a robot may be programmed to insert different information technology modules at different insertion depths.

Figure 10:
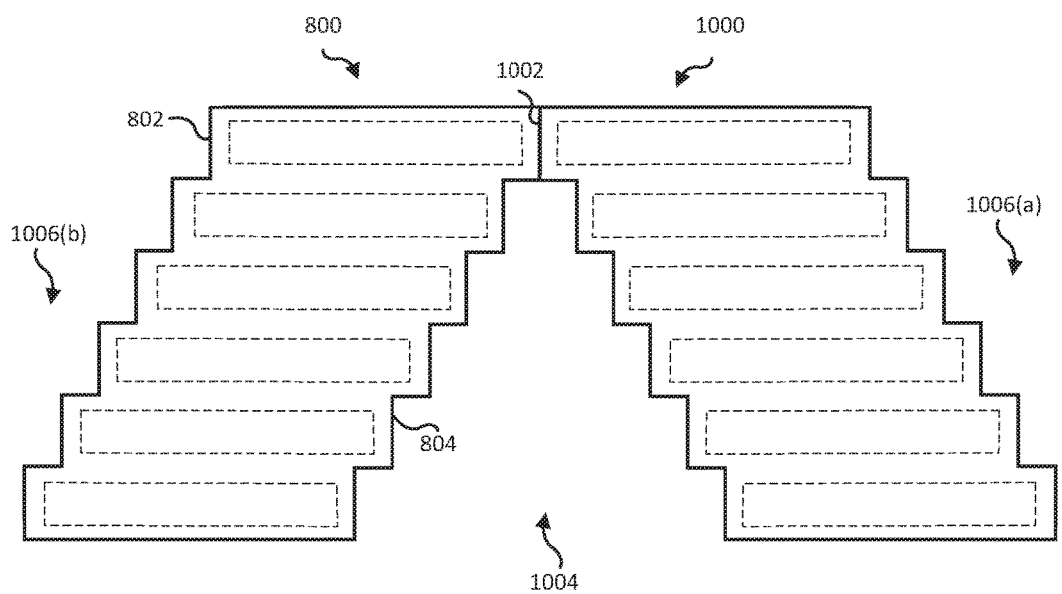
FIG. 10 is a side view of two abutting information technology rack frames with ascending configurations.

In one example, a frame with support bars 802 and 804 of information technology rack 800 may itself have an ascending configuration, as shown in FIG. 10. For example, support bars 802 and 804 may mimic the configuration of a staircase in which portions of support bars 802 and 804 ascend in a step-like fashion. In this example, the ascending or step-like configuration of support bars 802 and 804 may itself serve as a mounting structure sufficient to mount a plurality of information technology modules in an ascending configuration in which an insertion depth of a superior information technology module is greater than an insertion depth of an inferior information technology module.

In one such example, as shown in FIG. 10, a face of information technology rack 800 may abut a face of an additional information technology rack 1000 (e.g., in a "back-to-back" configuration). In this example, the two information technology racks may attach at an attachment point 1002, which may (in some examples) be located at an apex of the two information technology racks. In one embodiment, a cold-air aisle (such as cold-air aisle 1004 in FIG. 10) may be disposed between the two information technology racks and a hot-air aisle (such as hot-air aisle 1006(a) and hot-air aisle 1006(b) in FIG. 10) may be disposed on the opposite face of each information technology rack. In this example, the "back-to-back" configuration illustrated in FIG. 10 may (1) create a "sealed" cold-air aisle 1004 that effectively contains the conditioned air necessary to cool information technology modules and (2) facilitate the ventilation of air heated by inferior information technology modules upwards through convection. Alternatively, a hot-air aisle may be disposed between the two information technology racks and a cold-air aisle may be disposed on the opposite face of each information technology rack.

In some examples, the ascending configurations described above may facilitate the ventilation of hot air by minimizing the amount that superior information technology modules block the heat escaping from inferior information technology modules. For example, as shown in FIG. 8, super-superior information technology module 814 may be positioned such that heat generated by superior information technology module 808 may escape out the back end of superior information technology module 808 in the direction illustrated by arrow 816 without being blocked by super-superior information technology module 814.

In one example, the instant disclosure may include a system that includes an information technology rack with at least one of the features discussed above (e.g., with a canted mounting structure and/or with ascending information technology modules). In one such example, the system may include only a single information technology rack with at least one of the features discussed above. Alternatively, the system may include a linear aisle of a group of information technology racks that includes information technology rack 100.

In some embodiments, a method for manufacturing, assembling, using, adjusting, or otherwise configuring or creating the systems described herein may include coupling at least one mounting structure to a frame of an information technology rack where the frame includes a group of vertical support bars that together define an equipment bay for housing information technology modules. In one example, each vertical support bar may be oriented substantially perpendicular relative to a floor on which the information technology rack stands and the method may include mounting an information technology module to the mounting structure coupled to the frame in a substantially non-horizontal orientation relative to the floor on which the information technology rack stands. Using FIG. 4 as an example, canted mounting structure 112 may be coupled to the frame of information technology rack 100 and information technology module 400 may be mounted to canted mounting structure 112 in a substantially non-horizontal orientation relative to the floor on which information technology rack 100 stands. In additional or alternative examples, the method may include inserting information technology modules at varying insertion depths to create an ascending configuration.

As discussed throughout the instant disclosure, the disclosed methods, systems, and devices may provide one or more advantages over traditional information technology racks. For example, by orienting mounting structures within an information technology rack such that an information technology modules may rest on the mounting structures in a canted orientation relative to the floor, the disclosed methods, systems, and devices may improve air flow dynamics by facilitating the upward release of hot air.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the instant disclosure. The embodiments disclosed herein should be considered in all respects illustrative and not restrictive. Reference should be made to the appended claims and their equivalents in determining the scope of the instant disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. An information technology rack comprising:
   a frame comprising a plurality of vertical support bars, which include a set of frontal support bars and a set of terminal support bars, that together define an equipment bay for housing information technology modules, wherein:
   the frame is disposed in a data center comprising a cold-air aisle abutting the set of frontal support bars and a hot-air aisle abutting the set of terminal support bars; and
   each vertical support bar is oriented substantially perpendicular relative to a floor on which the information technology rack stands; and
   at least one mounting structure, coupled to the vertical support bars of the frame, that fixes at least one information technology module to the frame within the equipment bay at a fixed canted orientation that is neither horizontal nor vertical relative to the floor on which the information technology rack stands, wherein a robot is configured to insert the information technology module into the equipment bay at a canted orientation via at least one of the hot-air aisle or the cold-air aisle.

2. The information technology rack of claim 1, wherein the mounting structure comprises at least one of:
   one or more support shelves;
   one or more mounting holes defined in the vertical support bars;
   one or more mounting posts coupled to the vertical support bars;
   one or more brackets mounted to the vertical support bars; or
   one or more screws coupled to the vertical support bars.

3. The information technology rack of claim 1, wherein the information technology module comprises at least one of:
   a server;
   a power supply;
   a network switch; or
   a battery backup unit.

4. The information technology rack of claim 1, wherein the canted orientation of the mounting structure facilitates the ventilation of air heated by the information technology module upwards through convection.

5. The information technology rack of claim 1, wherein the canted orientation of the mounting structure facilitates, through the force of gravity, at least one blind-mate connection between a connector of the information technology module and a corresponding connector coupled to the frame.

6. The information technology rack of claim 1, wherein:
   the rack comprises a frontal end and a terminal end;
   a blind-mate for a connection between a connector of the information technology module and a corresponding connector, coupled to the frame, is disposed at the terminal end of the rack; and
   the robot is configured to insert the information technology module into the equipment bay from the frontal end of the rack.

7. The information technology rack of claim 1, wherein the mounting structure comprises a power shelf.

8. The information technology rack of claim 7, wherein the power shelf is configured to house at least one of a rectifier or a battery.

9. A system comprising:
   an information technology rack that comprises:
   a frame comprising a plurality of vertical support bars, which include a set of frontal support bars and a set of terminal support bars, that together define an equipment bay for housing information technology modules, wherein:
   the frame is disposed in a data center comprising a cold-air aisle abutting the set of frontal support bars and a hot-air aisle abutting the set of terminal support bars; and each vertical support bar is oriented substantially perpendicular relative to a floor on which the information technology rack stands; and at least one mounting structure, coupled to the vertical support bars of the frame, that fixes at least one information technology module to the frame within the equipment bay at a fixed canted orientation that is neither horizontal nor vertical relative to the floor on which the information technology rack stands, wherein a robot is configured to insert the information technology module into the equipment bay at a canted orientation via at least one of the hot-air aisle or the cold-air aisle; and the information technology module mounted.

10. The system of claim 9, further comprising a linear aisle comprising a plurality of information technology racks that includes the information technology rack.

11. The system of claim 9, wherein the mounting structure comprises at least one of:
one or more support shelves coupled to the vertical support bars;
one or more mounting holes defined in the vertical support bars;
one or more brackets mounted to the vertical support bars;
one or more screws coupled to the vertical support bars; or
one or more mounting posts coupled to the vertical support bars.

12. The system of claim 9, wherein the information technology module comprises at least one of:
a server;
a power supply;
a network switch; or
a battery backup unit.

13. The system of claim 9, wherein the canted orientation of the mounting structure facilitates the ventilation of air heated by the information technology module upwards through convection.

14. The system of claim 9, wherein the canted orientation of the mounting structure facilitates, through the force of gravity, at least one blind-mate connection between a connector of the information technology module and a corresponding connector.

15. A method comprising:
coupling at least one mounting structure to a frame of an information technology rack, wherein:

the frame comprises a plurality of vertical support bars, which include a set of frontal support bars and a set of terminal support bars, that together define an equipment bay for housing information technology modules;
the frame is disposed in a data center comprising a cold-air aisle abutting the set of frontal support bars and a hot-air aisle abutting the set of terminal support bars; and
each vertical support bar is oriented substantially perpendicular relative to a floor on which the information technology rack stands; and mounting an information technology module to the mounting structure coupled to the frame in a canted orientation that is neither horizontal nor vertical relative to the floor on which the information technology rack stands, wherein a robot is configured to insert the information technology module into the equipment bay at a canted orientation via at least one of the hot-air aisle or the cold-air aisle.

16. The method of claim 15, wherein the mounting structure comprises one or more support shelves.

17. The method of claim 15, wherein the information technology module comprises at least one of:
a server;
a power supply;
a network switch; or
a battery backup unit.

18. The method of claim 15, wherein the canted orientation of the mounting structure facilitates the ventilation of air heated by the information technology module upwards through convection.

19. The method of claim 15, wherein the canted orientation of the mounting structure facilitates, through the force of gravity, at least one blind-mate connection between a connector of the information technology module and a corresponding connector coupled to the frame.

20. The method of claim 15, wherein the mounting structure comprises:
one or more mounting holes defined in the vertical support bars;
one or more mounting posts coupled to the vertical support bars;
one or more brackets mounted to the vertical support bars; or
one or more screws coupled to the vertical support bars.

* * * * *